(12) United States Patent
Tamura et al.

(10) Patent No.: US 7,541,246 B2
(45) Date of Patent: Jun. 2, 2009

(54) METHOD OF MANUFACTURING SEMICONDUCTOR DEVICE

(75) Inventors: Yasuyuki Tamura, Ibaraki (JP); Takaoki Sasaki, Yamagata (JP)

(73) Assignee: Fujitsu Limited, Kawasaki-shi, Kanagawa (JP)

( * ) Notice: Subject to any disclaimer, the term of this patent is extended or adjusted under 35 U.S.C. 154(b) by 335 days.

(21) Appl. No.: 11/463,924

(22) Filed: Aug. 11, 2006

(65) Prior Publication Data

US 2006/0273412 A1 Dec. 7, 2006

Related U.S. Application Data

(62) Division of application No. 11/013,541, filed on Dec. 17, 2004, now Pat. No. 7,138,692.

(30) Foreign Application Priority Data

Jun. 14, 2004 (JP) ............................. 2004-175803

(51) Int. Cl.
*H01L 21/336* (2006.01)

(52) U.S. Cl. ................. 438/287; 438/769; 438/770; 438/774; 438/775; 438/785; 257/411; 257/E21.194; 257/E21.276

(58) Field of Classification Search ............. 438/287, 438/774, 775; 257/E21.194, E21.276
See application file for complete search history.

(56) References Cited

U.S. PATENT DOCUMENTS 5,712,208 A * 1/1998 Tseng et al. ................. 438/770

| 6,191,463 | B1 | 2/2001 | Mitani et al. |
| 6,642,131 | B2 | 11/2003 | Harada |
| 6,700,170 | B1 | 3/2004 | Morosawa et al. |
| 6,784,508 | B2 | 8/2004 | Tsunashima et al. |

(Continued)

FOREIGN PATENT DOCUMENTS

JP 08-316465 11/1996

(Continued)

OTHER PUBLICATIONS

Schroder et al., "Negative bias temperature instability: Road to cross in deep submicron silicon semiconductor manufacturing", Journal of Applied Physics, Jul. 1, 2003, pp. 1-18, vol. 94, No. 1.

(Continued)

*Primary Examiner*—Kenneth A Parker
*Assistant Examiner*—Jose R Diaz
(74) *Attorney, Agent, or Firm*—Leydig, Voit & Mayer, Ltd.

(57) ABSTRACT

A gate insulating film and a gate electrode are formed on a silicon substrate. The gate insulating film contains at least hafnium, oxygen, fluorine, and nitrogen. The fluorine concentration is high in the vicinity of an interface with the silicon substrate and progressively decreases with decreasing distance from the gate electrode. The nitrogen concentration is high in the vicinity of an interface with the gate electrode and progressively decreases with decreasing distance from the silicon substrate. The fluorine concentration in the vicinity of the interface with the silicon substrate is preferably $1 \times 10^{19}$ cm$^{-3}$ or more. The nitrogen concentration in the vicinity of the interface with the gate electrode is preferably $1 \times 10^{20}$ cm$^{-3}$ or more.

9 Claims, 13 Drawing Sheets

U.S. PATENT DOCUMENTS 7,002,224 B2 * 2/2006 Li .............................. 257/405
2004/0084736 A1 5/2004 Harada

FOREIGN PATENT DOCUMENTS

| JP | 11-97683 | 4/1999 |
|---|---|---|
| JP | 2000-243960 | 9/2000 |
| JP | 2001-257344 | 9/2001 |
| JP | 2003-8011 | 1/2003 |
| JP | 2003-318176 | 11/2003 |

OTHER PUBLICATIONS

Quevedo-Lopez et al., "Effect of N incorporation on boron penetration from p+ polycrystalline-Si through $HfSi_xO_y$ films", Applied Physics Letters, Jun. 30, 2003, pp. 4669-4671, vol. 82, No. 26.

"Process Integration, Devices, and Structures", The International Technology Roadmap for Semiconductors: 2003, p. 199, 203, 205.

* cited by examiner

METHOD OF MANUFACTURING SEMICONDUCTOR DEVICE

BACKGROUND OF THE INVENTION

1. Field of the Invention

The present invention relates to a semiconductor device and a manufacturing method therefor, and more particularly to a semiconductor device including a gate insulating film formed on a silicon substrate and a gate electrode formed on the gate insulating film, and a manufacturing method for the semiconductor.

2. Background Art

In recent years, the integration density of semiconductor integrated circuit devices has considerably increased. As such, devices such as transistors in MOS (Metal Oxide Semiconductor) semiconductor devices have been miniaturized and enhanced in performance. Especially, gate insulating films, which are a component of the MOS structure, have become thinner and thinner to accommodate the miniaturization, higher-speed operation, and lower-voltage operation of the transistors.

Gate insulating films have been traditionally formed of an $SiO_2$ (silicon oxide) film. On the other hand, as gate electrodes have been miniaturized, the gate insulating films have been reduced in thickness. However, considerably reducing the thickness of a gate insulating film causes carriers (electrons and holes) to pass through the film, thereby increasing the tunneling current, or gate current. According to ITRS (International Technology Roadmap for Semiconductors) 2003, the 65 nm generation semiconductor devices, which are expected to become available in 2007, require gate insulating films having an equivalent oxide thickness of 0.9 nm - 1.6 nm. However, when an $SiO_2$ film is used as a gate insulating film, the gate leakage current due to the tunneling current exceeds the maximum permissible value, requiring a new material to be employed instead of the $SiO_2$ film.

Research efforts have been made to use materials having a higher relative permittivity than $SiO_2$ films for gate insulating films. High dielectric constant insulating films (hereinafter referred to as High-k films) gaining attention include $HfO_2$ (hafnium oxide) films, $HfAlO_x$ (hafnium aluminate) films, and $HfSiO_x$ (hafnium silicate) films.

However, phase separation, crystallization, etc. are likely to occur with a High-k film, causing the problem of boron (B) in the gate electrode penetrating through the High-k film to the substrate and thereby changing the transistor threshold voltage considerably. To overcome this problem, a method is proposed for adding nitrogen(N) into the High-k film to prevent boron penetration (see M. A. Quevedo-Lopez et al., Applied Physics Letters, 2003, p. 4669-4670).

Adding nitrogen into the High-k film, however, leads to a large reduction in the drive power when a low voltage relative to the substrate is continuously applied to the gate electrode at a high temperature, which is referred to as negative bias temperature instability (NBTI). On the other hand, adding fluorine into the film improves reliability factors such as NBTI, but promotes boron penetration (see Dieter K. Schroder et al., Journal of Applied Physics, 2003, p. 1-18).

Thus, nitrogen and fluorine have opposite effects on the problems of boron penetration and NBTI. Therefore, simply adding both elements into the High-k film, as is conventionally done, cannot solve these problems.

SUMMARY OF THE INVENTION

The present invention has been devised in view of the above problems. It is, therefore, an object of the present invention to provide a semiconductor device capable of solving the problems of both boron penetration and NBTI, and a manufacturing method therefor.

According to one aspect of the present invention, a semiconductor device comprises a silicon substrate, a gate insulating film formed on the silicon substrate, and a gate electrode formed on the gate insulating film. The gate insulating film contains at least hafnium, oxygen, fluorine, and nitrogen. The gate insulating film is formed such that the concentration of the fluorine is high in a vicinity of the interface to the silicon substrate and progressively decreases with decreasing distance from the gate electrode, and the concentration of the nitrogen is high in a vicinity of the interface to the gate electrode and progressively decreases with decreasing distance from the silicon substrate.

According to another aspect of the present invention, a semiconductor device comprises a silicon substrate, a gate insulating film formed on the silicon substrate, and a gate electrode formed on the gate insulating film. The gate insulating film contains at least hafnium, oxygen, fluorine, and nitrogen. The gate insulating film is formed such that in regions other than a vicinity of the interface to the silicon substrate, the concentration of the nitrogen is higher than that of the fluorine.

According to other aspect of the present invention, in a method for manufacturing a semiconductor device, a device isolation region is formed in a silicon substrate. Fluorine is ion-implanted in the silicon substrate. The silicon substrate is thermally oxidized so as to form a fluorine containing silicon oxide film on a surface of the silicon substrate. A high dielectric constant insulating film is formed on the fluorine containing silicon oxide film. A silicon nitride film is formed on the high dielectric constant insulating film. A silicon film is formed on the silicon nitride film. The silicon film is processed so as to form a gate electrode.

According to other aspect of the present invention, in a method for manufacturing a semiconductor device, a device isolation region is formed in a silicon substrate. The silicon substrate is thermally oxidized so as to form a silicon oxide film on a surface of the silicon substrate. A high dielectric constant insulating film is formed on the silicon oxide film. A surface of the high dielectric constant insulating film is performed plasma nitrided process. After the plasma nitrided process, a silicon film is formed on the high dielectric constant insulating film. The silicon film is processed so as to form a gate electrode. Fluorine is ion-implanted in the silicon substrate using the gate electrode as a mask. The silicon substrate is heat-treated to diffuse the fluorine and thereby the silicon oxide film is transformed into a fluorine containing silicon oxide film.

Other objects and advantages of the present invention will become apparent from the following description.

DETAILED DESCRIPTION OF THE PREFERRED EMBODIMENTS

First Embodiment

Figure 1:
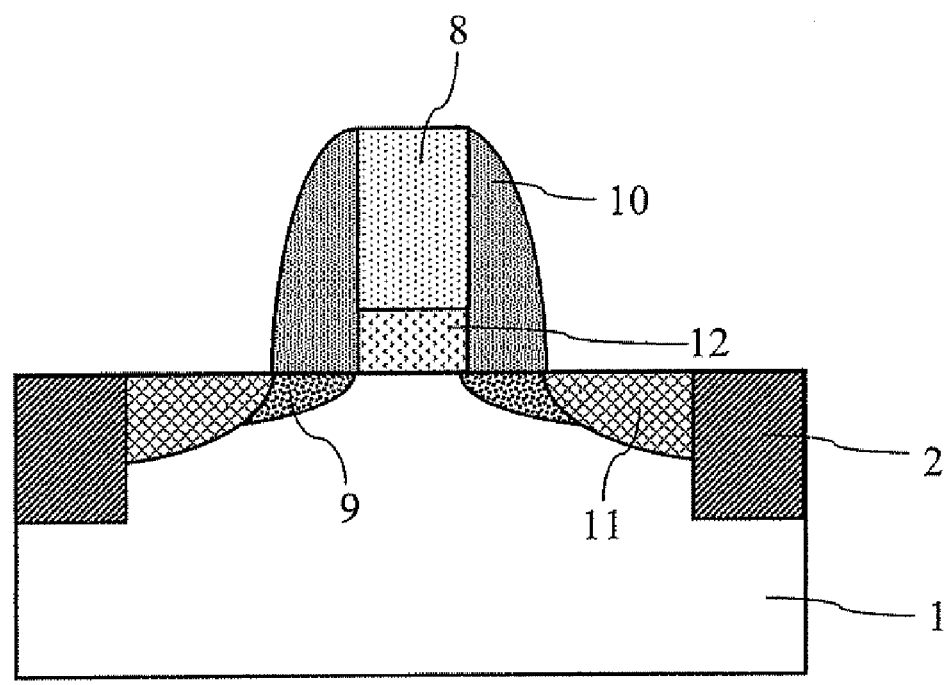
FIG. 1 is a cross-sectional view of a semiconductor device according to a first embodiment of the present invention.

FIG. 1 is a cross-sectional view of a semiconductor device according to a first embodiment of the present invention. Referring to the figure, a gate insulating film 12 and a gate electrode 8 are formed above a silicon substrate 1. The present invention is characterized by the gate insulating film 12 formed such that: it contains at least hafnium, oxygen, fluorine, and nitrogen; the fluorine concentration is high in the vicinity of the interface to the silicon substrate 1 and progressively decreases with decreasing distance from the gate electrode 8; and the nitrogen concentration is high in the vicinity of the interface to the gate electrode 8 and progressively decreases with decreasing distance from the silicon substrate 1.

A description will be given of a method for manufacturing an MISFET (Metal Insulator Semiconductor Field Effect Transistor) according to the present embodiment with reference to FIGS. 2 to 9. It should be noted that in these figures, like numerals will be used to denote like components.

First of all, a silicon oxide film is buried in predetermined regions in the silicon substrate 1, forming device isolation regions 2 having an STI (Shallow Trench Isolation) structure. Then, the silicon substrate 1 is thermally oxidized to form a silicon oxide film (SiO$_2$ film) 3 on the surface of the silicon substrate 1, producing the structure shown in FIG. 2.

Figure 2:
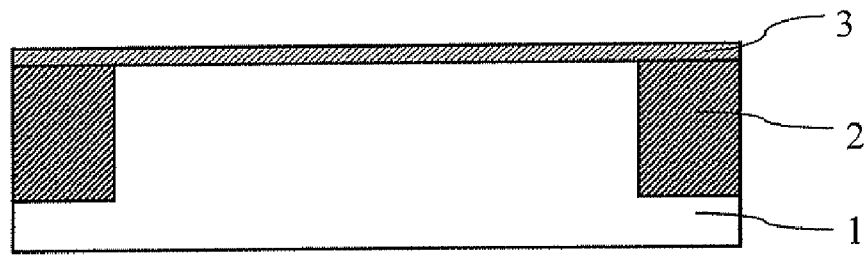
FIGS. 2 to 9 are cross-sectional views illustrating a method for manufacturing a semiconductor device according to the first embodiment.

A first characteristic of the present embodiment is that fluorine (F) is ion-implanted in the silicon substrate 1 after forming the structure shown in FIG. 2. At that time, the fluorine dose amount is preferably $1 \times 10^{12}$ cm$^{-2}$ to $1 \times 10^{16}$ cm$^{-2}$. For example, the dose amount may be set to $5 \times 10^{15}$ cm$^{-2}$.

Figure 3:
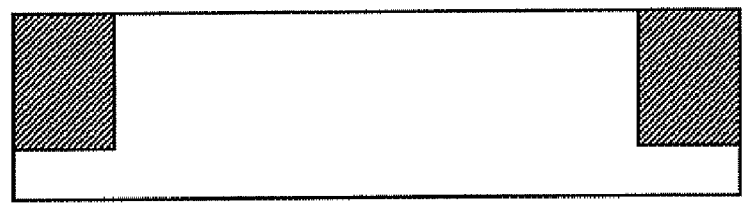

According to the present embodiment, the silicon oxide film 3 functions to prevent the surface of the silicon substrate 1 from being contaminated when fluorine is implanted. Therefore, after the fluorine implantation process, the silicon oxide film 3 is removed by wet etching using hydrofluoric acid, etc., as shown in FIG. 3. It should be noted that according to the present embodiment, the silicon oxide film 3 may be omitted; fluorine may be implanted immediately after forming the device isolation regions 2.

Figure 4:
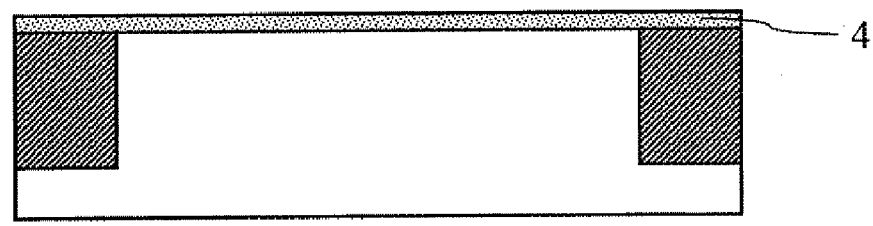

Then, the silicon substrate 1 is thermally oxidized to form a silicon oxide film 4 containing fluorine (hereinafter referred to as a fluorine containing silicon oxide film 4) on the surface of the silicon oxide film 1, as shown in FIG. 4. The thickness of the fluorine containing silicon oxide film 4 is preferably 1 nm or less. For example, the film thickness may be set to approximately 0.5 nm.

Figure 5:
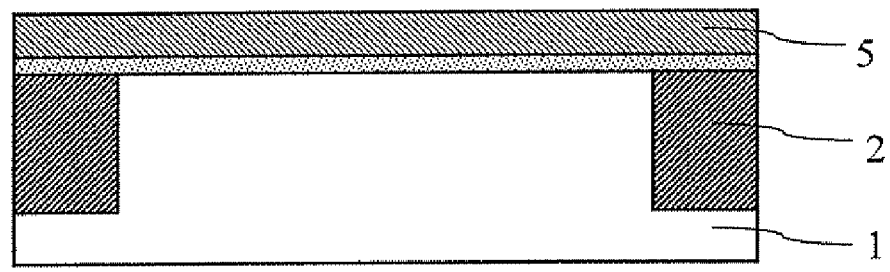

After forming the fluorine containing silicon oxide film 4, a High-k film 5 is formed on it, as shown in FIG. 5. The thickness of the High-k film 5 is preferably 5 nm or less. The High-k film of the present embodiment contains hafnium (Hf) and oxygen (O). That is, it may be an HfO$_2$ (hafnium oxide) film, HfAlO$_x$ (hafnium aluminate) film, HfSiO$_x$ (hafnium silicate) film, or the like. For example, an HfSiO$_x$ film having a thickness of approximately 3 nm may be formed on the fluorine containing silicon oxide film 4 by a CVD (Chemical Vapor Deposition) technique.

After forming the High-k film 5, PDA (Post Deposition Annealing) is preferably applied to modify the film. This makes it possible to reduce the amount of hydrogen present in the High-k film 5 due to impurities in the film by a factor of approximately 10. Further, even though C (carbon) is generally easily absorbed to the surface of the High-k film 5, such an impurity can also be removed by PDA.

Figure 6:
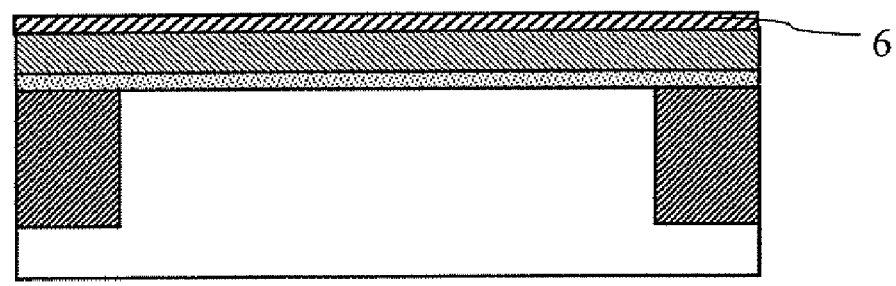

Then, a silicon nitride (SiN) film 6 is formed on the High-k film 5, as shown in FIG. 6. The thickness of the silicon nitride film 6 is preferably 1 nm or less. For example, the silicon nitride film 6 may be formed by a CVD technique to a thickness of approximately 1 nm. Thus, a second characteristic of the present embodiment is that a silicon nitride film is formed between the High-k film and the gate electrode.

Figure 7:
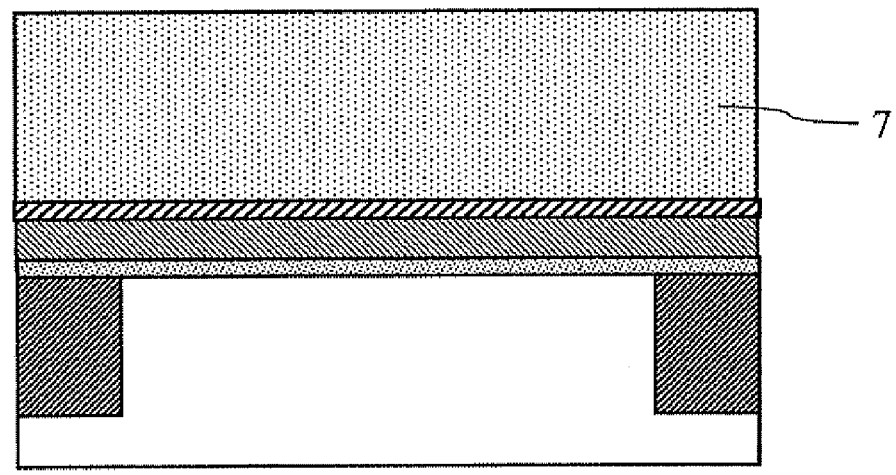

Then, a polysilicon film 7 is formed on the silicon nitride film 6 as a gate electrode material, as shown in FIG. 7. For example, the polysilicon film 7 may be formed by an LPCVD (Low Pressure Chemical Vapor Deposition) technique to a thickness of approximately 150 nm. It should be noted that according to the present embodiment, an amorphous silicon film or a silicon germanium film may be used instead of the polysilicon film.

Figure 8:
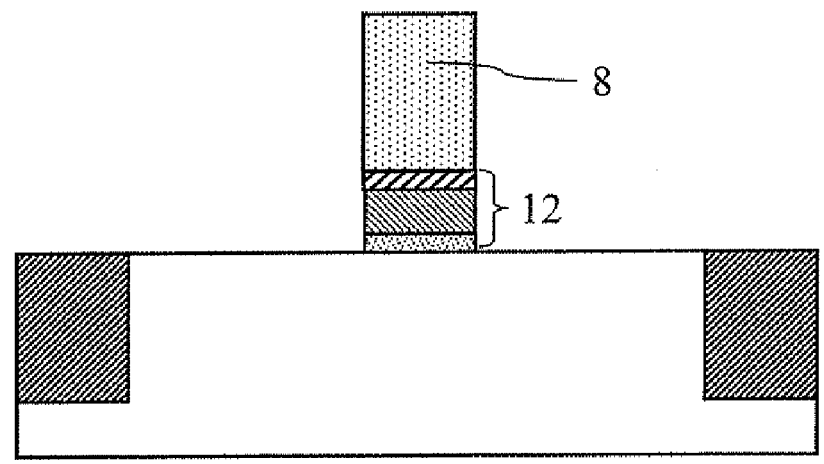

Then, the polysilicon film 7 is ion-implanted with impurities of an appropriate type and processed into a gate electrode shape by a photolithographic technique. Furthermore, the silicon nitride film 6, the High-k film 5, and the fluorine containing silicon oxide film 4 are also processed to form the gate electrode 8 and the gate insulating film 12, as shown in FIG. 8.

Then, impurities of an appropriate type are ion-implanted in the silicon substrate 1 using the gate electrode 8 as a mask. After that, a heat treatment is carried out for activation, forming an extension region 9.

It should be noted that in order to suppress short channel effects, the impurity concentration may be increased in an area surrounding the extension region 9 so as to form a halo region (not shown).

Then, a silicon oxide film (not shown) is formed on the entire surface by an LPCVD technique to a thickness of approximately 100 nm and processed by reactive ion etching so as to remove portions of the silicon oxide film other than those on the sides of the gate electrode 8 and the gate insulating film 12, thus forming a sidewall 10 on the sides of the gate electrode 8 and the gate insulating film 12.

Figure 9:
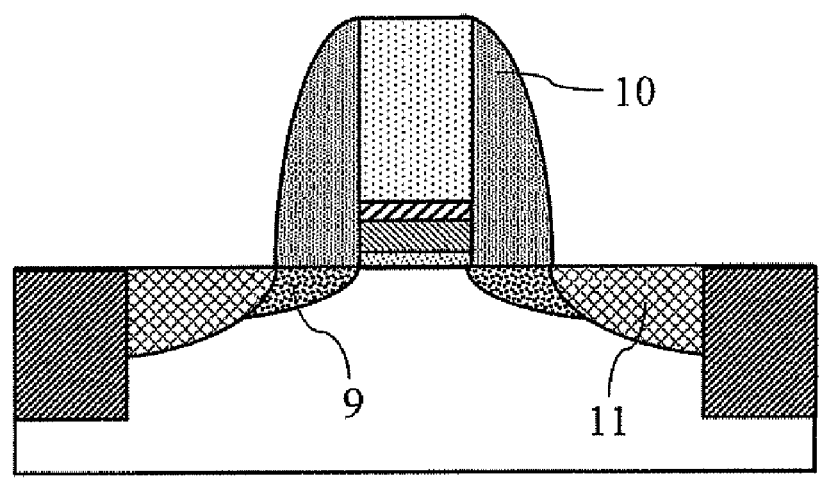

Then, impurities of an appropriate type are implanted in the silicon substrate 1 using the gate electrode 8 with the formed sidewall 10 as a mask. After that, a heat treatment is carried out for activation, forming a source/drain diffusion layer 11, as shown in FIG. 9.

Thus, the present embodiment forms the gate electrode 8 after sequentially forming the fluorine containing silicon oxide film 4, the High-k film 5, and the silicon nitride film 6. It should be noted that according to the present embodiment, the gate insulating film 12 is made up of the fluorine containing silicon oxide film 4, the High-k film 5, and the silicon nitride film 6.

It should be noted that a plurality of heat treatments are carried out after the silicon nitride film 6 forming process, causing atoms to diffuse from one film of the gate insulating film 12 to another Specifically, fluorine diffuses to the High-k film 5 and the silicon nitride film 6 while nitrogen diffuses to the High-k film 5 and the fluorine containing silicon oxide film 4. It should be noted that according to the present embodiment, fluorine is present only (or predominantly) in the layer (the fluorine containing silicon oxide film 4) under the High-k film 5 and nitrogen is present only (or predominantly) in the layer (the silicon nitride film 6) over the High-k film 5 before the diffusion of these elements occurs. Therefore, even after their diffusion, fluorine and nitrogen are not evenly distributed in the depth direction of the gate insulating film (the fluorine containing silicon oxide film 4 and the silicon nitride film 6 still contain high concentrations of fluorine and nitrogen, respectively).

That is, the gate insulating film of the present embodiment is formed such that: the fluorine concentration is high in the vicinity of the interface to the silicon substrate 1 and progressively decreases with decreasing distance from the gate electrode 8; and the nitrogen concentration is high in the vicinity of the interface to the gate electrode 8 and progressively decreases with decreasing distance from the silicon substrate 1. According to the present embodiment, the fluorine concentration in the vicinity of the interface to the silicon substrate 1 is preferably $1 \times 10^{19}$ cm$^{-3}$ or more, while the nitrogen concentration in the vicinity of the interface to the gate electrode 8 is preferably $1 \times 10^{20}$ cm$^{-3}$ or more.

Figure 10:
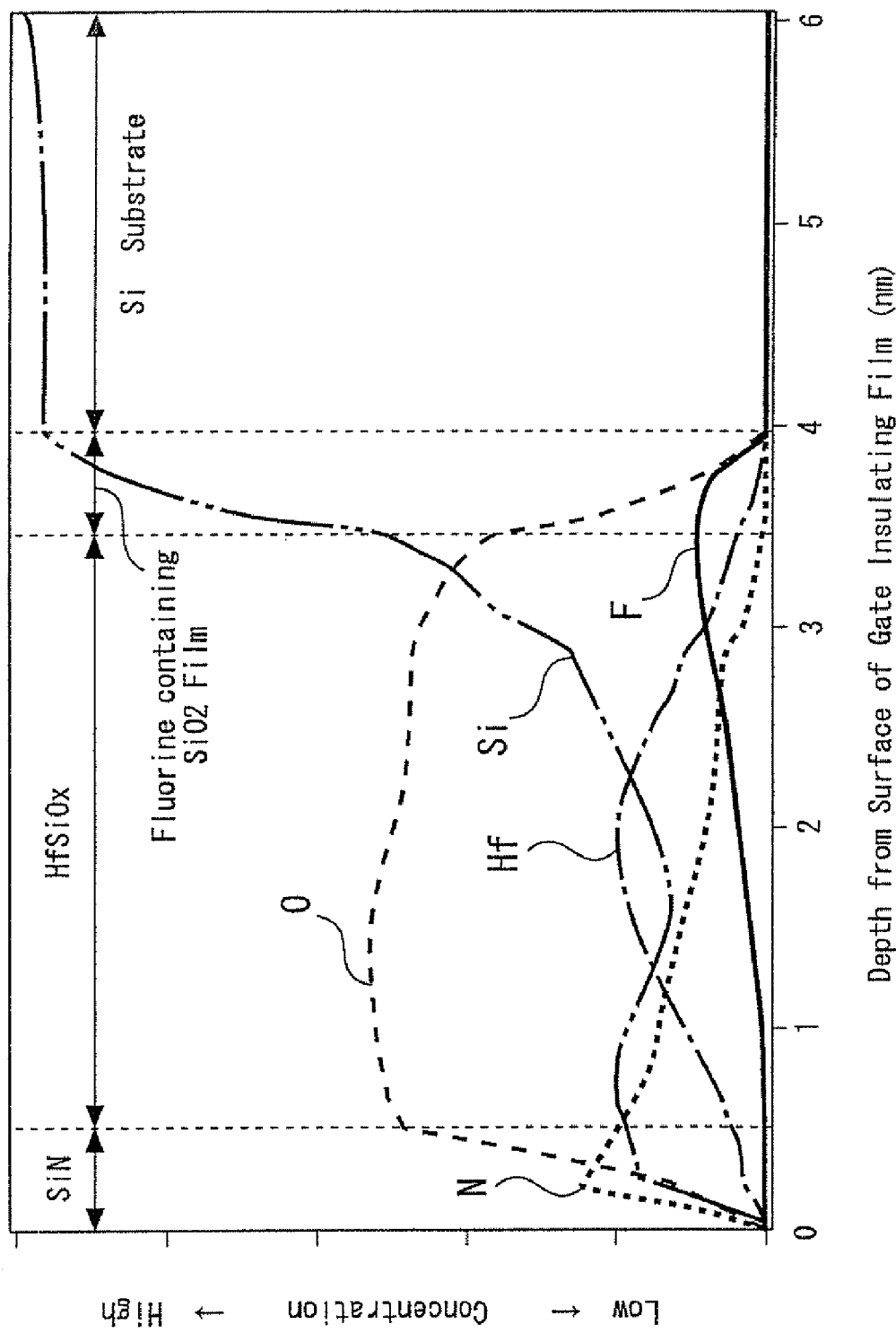
FIG. 10 is a diagram showing how the composition of a gate insulating film of the present invention changes along its depth direction.

FIG. 10 is a diagram showing how the composition of a gate insulating film of the present embodiment changes along its depth direction. It should be noted that the gate insulating film in FIG. 10 uses an HfSiO$_x$ film as the High-k film. The interface between the fluorine containing silicon oxide film and the silicon substrate is located at a depth of approximately 4 nm.

As can be seen from the figure, fluorine has diffused from the fluorine containing silicon oxide film to the HfSiO$_x$ film and the silicon nitride film while nitrogen has diffused from the silicon nitride film to the HfSiO$_x$ film and the fluorine containing silicon oxide film. After the diffusion, the fluorine concentration in the gate insulating film is (still) high on the silicon substrate side and progressively decreases as the gate electrode is approached. The nitrogen concentration, on the other hand, is high on the gate electrode side and progressively decreases as the silicon substrate is approached.

The composition distribution of the gate insulating film described above has the following effects. Since the gate insulating film contains a large amount of fluorine but substantially no nitrogen in the vicinity of the interface to the silicon substrate, the influence of fluorine is predominant in this region, allowing reliability factors such as NBTI to be effectively improved. On the other hand, since the gate insulating film contains a large amount of nitrogen but substantially no fluorine in the vicinity of the interface to the gate electrode, the influence of nitrogen is predominant in this region, allowing the penetration of boron from the gate electrode to be effectively suppressed. Therefore, the present invention can enhance reliability while solving the problem of boron penetration, which has not been achieved by conventional semiconductor devices in which fluorine and nitrogen are simply added into the High-k film.

Further, in FIG. 10, the concentration curves of nitrogen and fluorine in the gate insulating film intersect each other at a position 1 nm-1.5 nm from the interface to the silicon substrate. That is, the fluorine concentration is higher than the nitrogen concentration in the vicinity of the interface to the silicon substrate, but the nitrogen concentration is higher than the fluorine concentration in the other regions, which constitute most of the gate insulating film. Layer separation can be prevented from occurring with the High-k film by thus forming regions of the gate insulating film other than the vicinity of the interface to the silicon substrate such that their nitrogen concentration is higher than their fluorine concentration. It should be noted that the vicinity of the interface to the silicon substrate refers to the region extending 1 nm-1.5 nm from the interface in the thickness direction of the gate insulating film.

Figure 11:
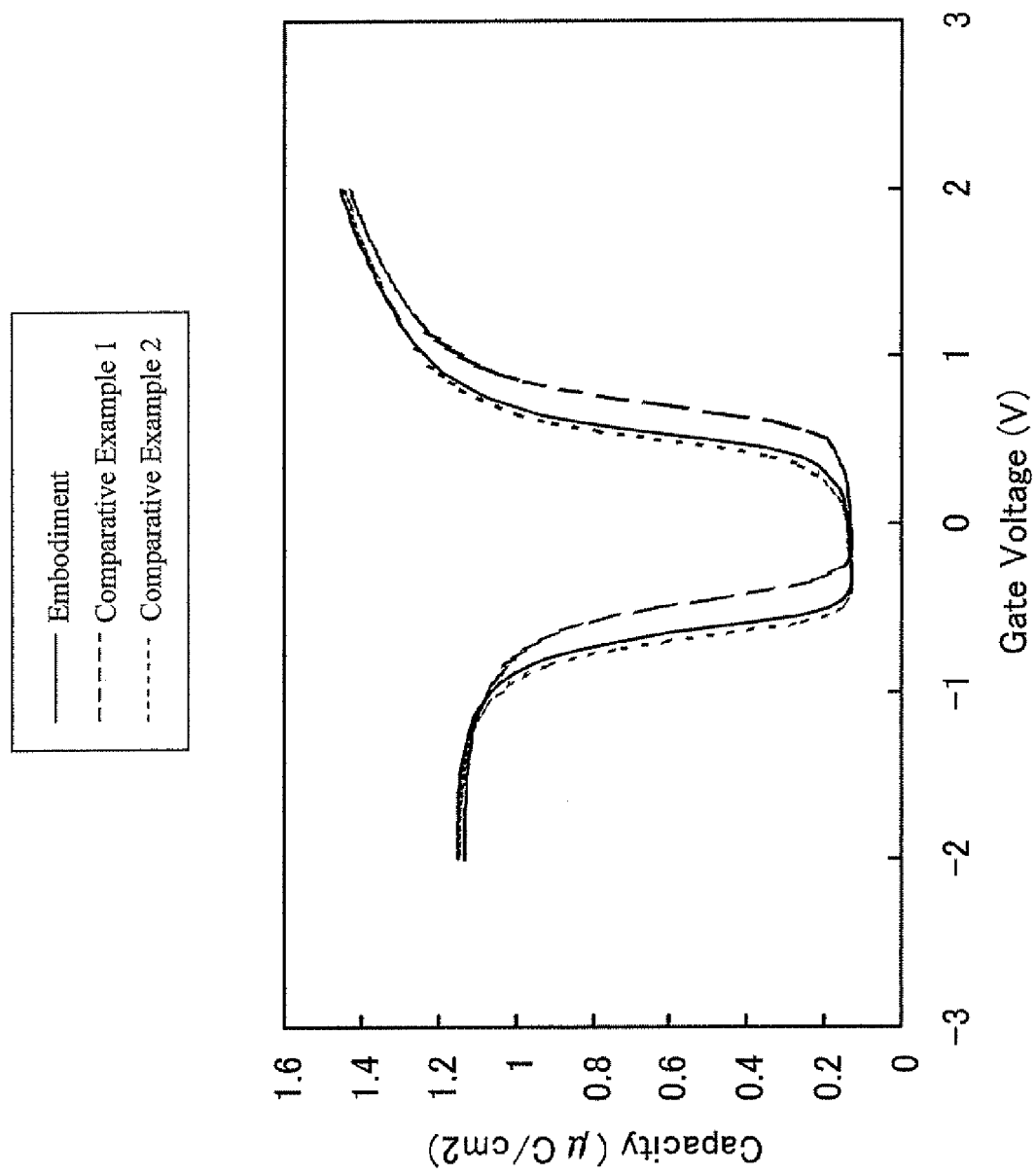
FIG. 11 is a diagram comparing the C-V curves of 3 types of gate insulating films each having a different composition distribution in the depth direction.

FIG. 11 compares the C-V curves of 3 types of gate insulating films each having a different composition distribution in the depth direction. It should be noted that the gate insulating films in FIG. 11 use an HfSiO$_x$ film as the High-k film. In the figure, the solid line represents the C-V curve of a gate insulating film of the present invention formed such that the fluorine concentration is high on the silicon substrate side whereas the nitrogen concentration is high on the gate electrode side. The long-dashed line represents the C-V curve of a gate insulating film (comparative example 1) formed such that the nitrogen concentration is constant in the depth direction whereas the fluorine concentration is high on the gate electrode side. Further, the short-dashed line represents the C-V curve of a gate insulating film (comparative example 2) formed such that it contains no fluorine and its nitrogen concentration is constant in the depth direction.

As shown in FIG. 11, the C-V curve of comparative example 1 is shifted toward the positive side (with respect to the other C-V curves) due to promotion of the penetration of boron from the gate electrode. The C-V curve of the gate insulating film of the present invention, on the other hand, is substantially identical to that of comparative example 2. This means that the gate insulating film of the present invention can suppress boron penetration even though it contains fluorine.

Figure 12:
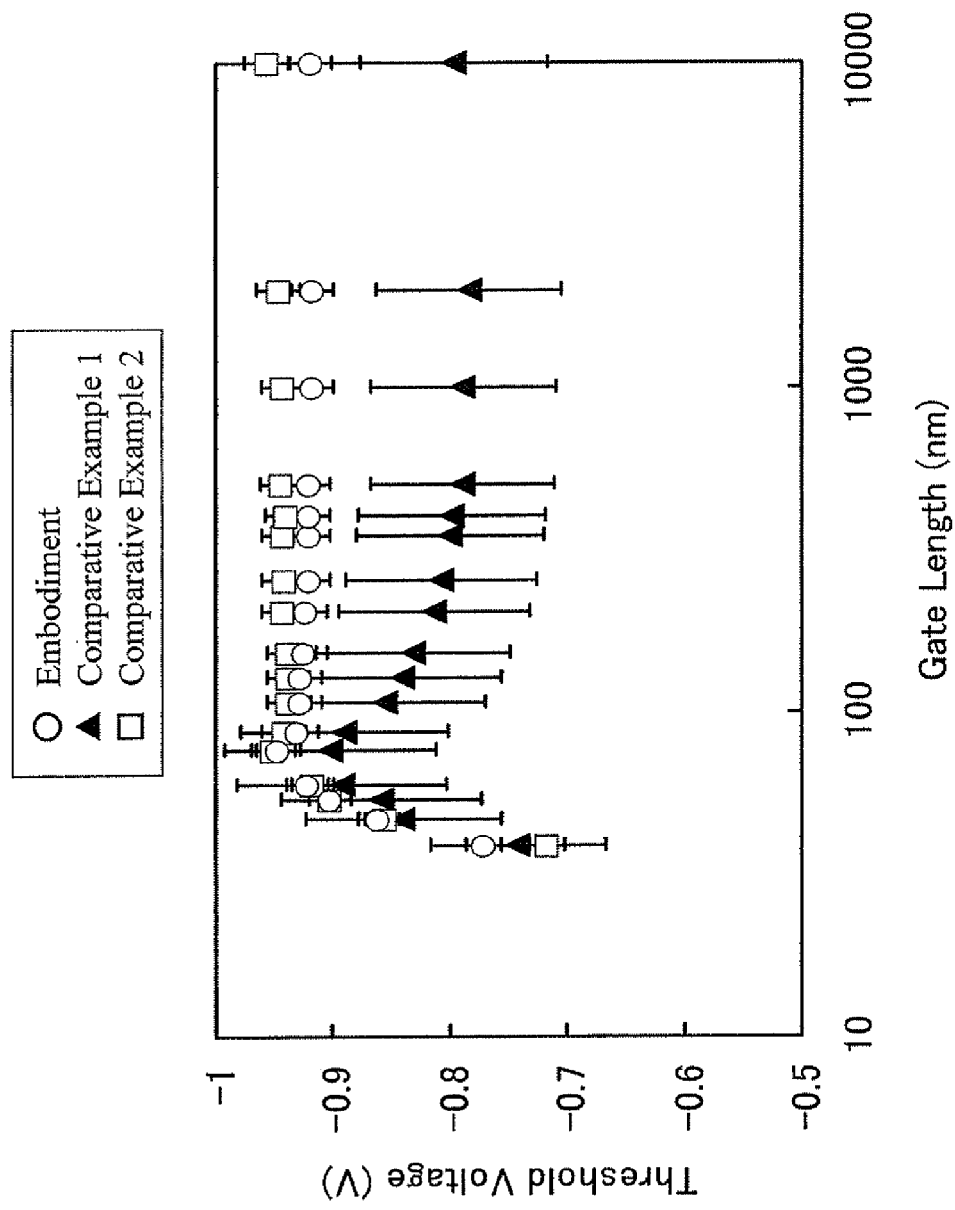
FIG. 12 is a diagram comparing the threshold voltage roll-off characteristics of PMOSFETs to which the 3 types of gate insulating films shown in FIG. 11 are applied.

FIG. 12 compares the threshold (voltage) roll-off characteristics of PMOSFETs (P-Channel Metal Oxide Semiconductor Field Effect Transistors) to which the 3 types of gate insulating films shown in FIG. 11 are applied. The figure indicates that the threshold voltages of the PMOSFETs using comparative example 1 are shifted toward the positive side and vary considerably (as compared to the threshold voltages of the other PMOSFETs) due to promotion of the penetration of boron from the gate electrode. The threshold voltages of the PMOSFETs of the present invention, on the other hand, are substantially equal to those of the PMOSFETs using comparative example 2. This means that the gate insulating film of the present invention can suppress boron penetration even though it contains fluorine.

Figure 13:
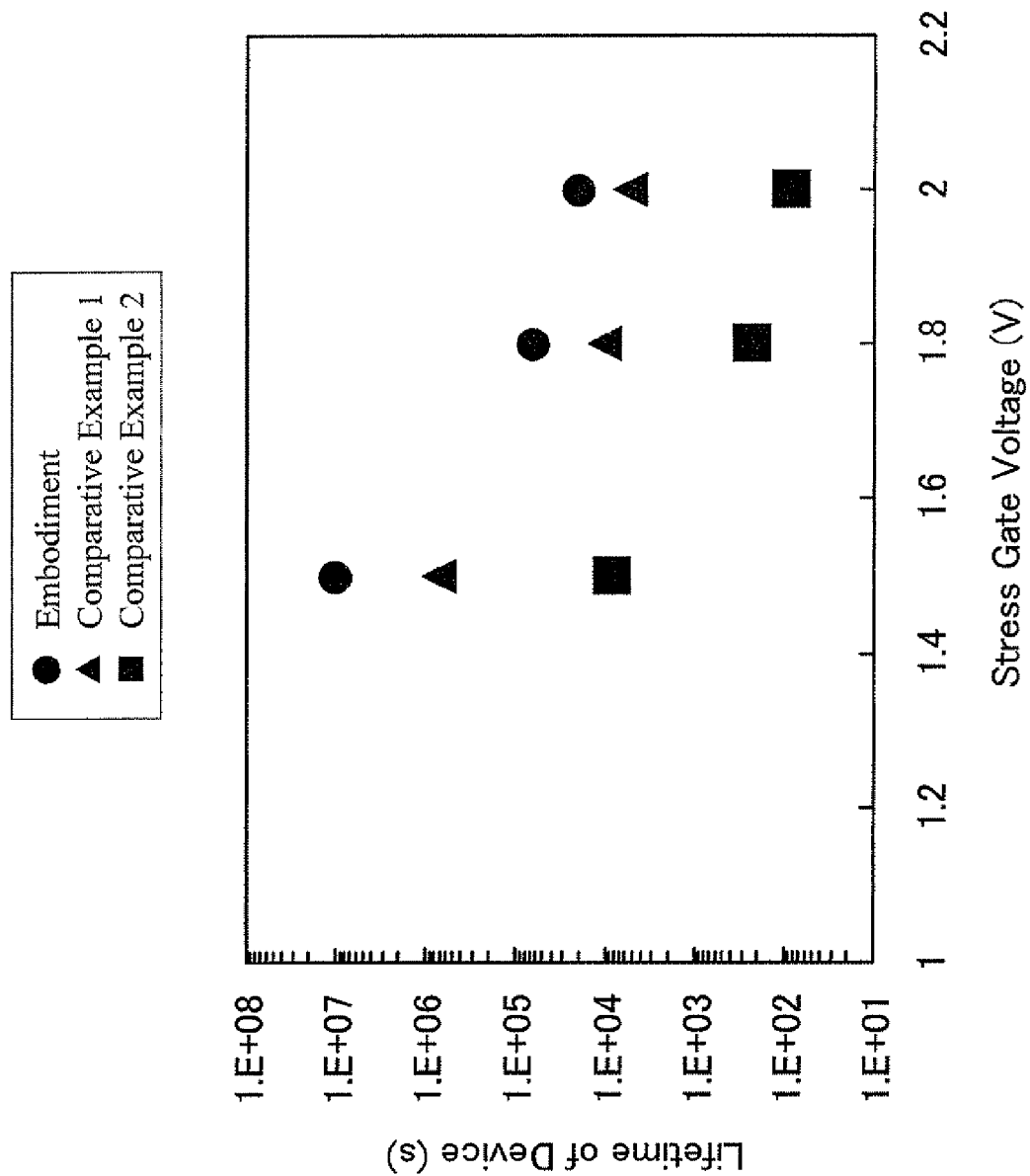
FIG. 13 is a diagram comparing the NBTIs of PMOSFETs to which the 3 types of gate insulating films shown in FIG. 11 are applied.

FIG. 13 compares the NBTIs of PMOSFETs to which the 3 types of gate insulating films shown in FIG. 11 are applied. The figure indicates that the lifetimes of the PMOSPETs using comparative example 2 are very short (as compared to the other PMOSFETs); they suffer from poor reliability. As shown in the figure, adding fluorine into the gate insulating film (as with the present invention and comparative example 1) leads to a long lifetime and high reliability, as compared to comparative example 2. Particularly, the present invention can provide higher reliability than even comparative example 1.

Second Embodiment

Figure 14:
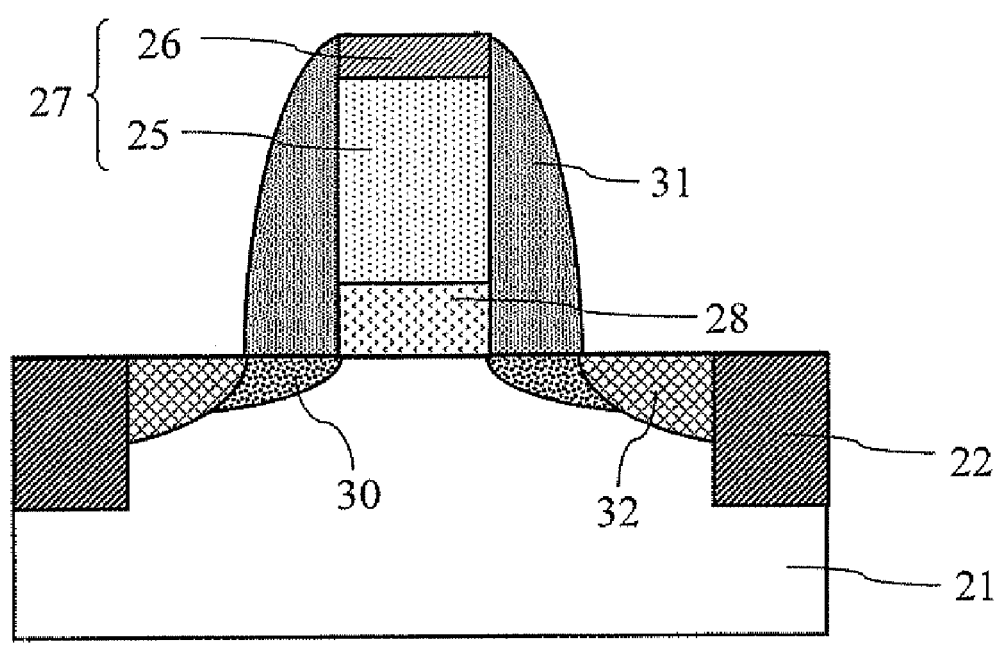
FIG. 14 is a cross-sectional view of a semiconductor device according to a second embodiment of the present invention.

FIG. 14 is a cross-sectional view of a semiconductor device according to a second embodiment of the present invention. Referring to the figure, a gate insulating film 28 and a gate electrode 27 are formed above a silicon substrate 21. The second embodiment, like the first embodiment, is characterized by the gate insulating film 28 formed such that: it contains at least hafnium, oxygen, fluorine, and nitrogen; the fluorine concentration is high in the vicinity of the interface to the silicon substrate 21 and progressively decreases with decreasing distance from the gate electrode 27; and the nitrogen concentration is high in the vicinity of the interface to the gate electrode 27 and progressively decreases with decreasing distance from the silicon substrate 21. It should be noted that according to the present embodiment, the silicon oxide film 26 shown in FIG. 14 may be omitted.

A description will be given of a method for manufacturing an MISEFT (Metal Insulator Semiconductor Field Effect Transistor) according to the present embodiment with reference to FIGS. 15 to 22. It should be noted that in these figures, like numerals will be used to denote like components.

Figure 15:
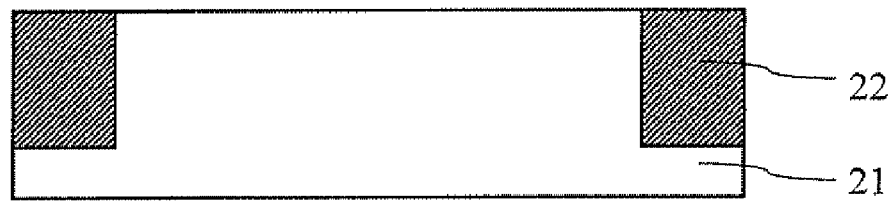
FIGS. 15 to 22 are cross-sectional views illustrating a method for manufacturing a semiconductor device according to the second embodiment.

First of all, a silicon oxide film is buried in predetermined regions in the silicon substrate 21, forming device isolation regions 22 having an STI (Shallow Trench Isolation) structure, as shown in FIG. 15. Then, the silicon substrate 21 is rinsed with hydrofluoric acid, etc. and thereby wet-etched, exposing a clean surface.

Figure 16:
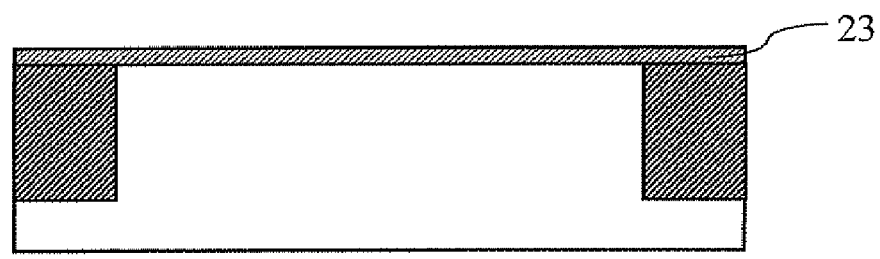

Then, the silicon substrate 21 is thermally oxidized to form a silicon oxide film ($SiO_2$ film) on the surface of the silicon substrate 21, as shown in FIG. 16. For example, the thickness of the silicon oxide film 23 may be set to approximately 0.5 nm.

Figure 17:
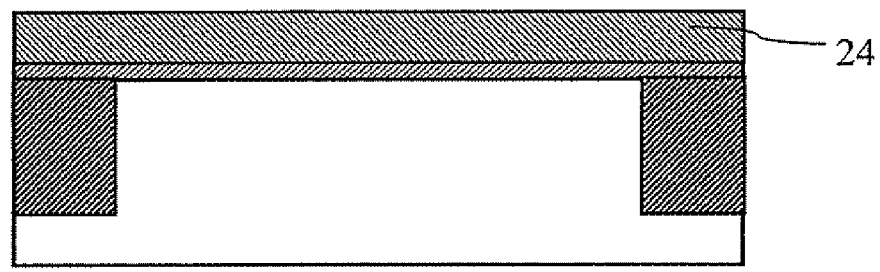

Then, a High-k film 24 is formed on the silicon oxide film 23, as shown in FIG. 17. The High-k film (24) of the present embodiment contains hafnium (Hf) and oxygen (O). That is, it may be an $HfO_2$ (hafnium oxide) film, $HfAlO_x$ (hafnium aluminate) film, $HfSiO_x$ (hafnium silicate) film, or the like. For example, an $HfSiO_x$ film having a thickness of approximately 3 nm may be formed on the silicon oxide film 23 by a CVD (Chemical Vapor Deposition) technique.

After forming the High-k film 24, PDA (Post Deposition Annealing) is preferably applied to modify the film. This makes it possible to reduce the amount of hydrogen present in the High-k film 24 due to impurities in the film by a factor of approximately 10. Further, even though C (carbon) is generally easily absorbed to the surface of the High-k film 24, such an impurity can also be removed by PDA.

Figure 18:
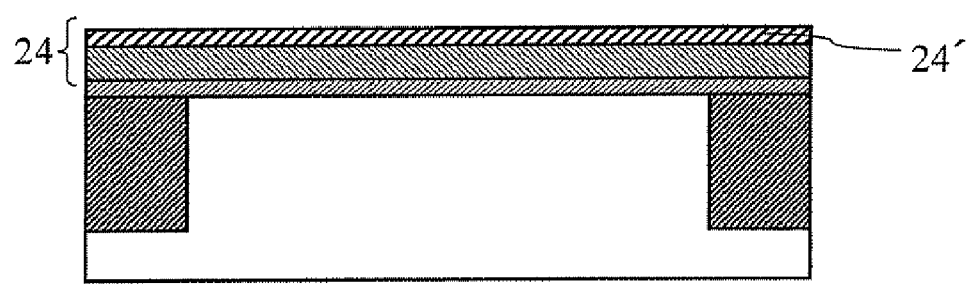

A first characteristic of the present embodiment is that a plasma nitrided process is performed on the High-k film 24 after the film is formed. This arrangement can increase the nitrogen concentration of the High-k film 24 in the vicinity of its surface. FIG. 18 schematically shows the nitrided portion (denoted by reference numeral 24') of the High-k film 24.

For example, when an $HfSiO_x$ film with a thickness of 3 nm is formed on the silicon oxide film 23 with a thickness of 0.5 nm as the High-k film 24, the plasma nitrided process may be performed under the first set of conditions (condition A) shown in table 1. In this case, the second set of conditions (condition B) shown in table 1 is not preferable since nitrogen will reach the vicinity of the interface to the silicon substrate 21 under these conditions, which reduces the carrier mobility and worsens the NBTI. Under the first set of conditions, on the other hand, only the surface of the $HfSiO_x$ film is nitrided. That is, it is possible to prevent nitrogen from going deep into the film, thereby preventing reduction of the carrier mobility and worsening of the NBTI.

TABLE 1

| | Ar gas flow rate (sccm) | $N_2$ gas flow rate (sccm) | Plasma power (kW) | Pressure (Pa) | Temperature (° C.) | Processing time (sec) |
|---|---|---|---|---|---|---|
| Condition A | 1,000 | 40 | 2 | 33 | 400 | 60 |
| Condition B | 1,000 | 40 | 2 | 7 | 400 | 60 |

Even though the High-k film can be nitrided by heat-treating it in an atmosphere containing $NH_3$ gas or $NO_x$ gas, it is not appropriate to apply such a method to the present invention. This is because the present invention is characterized in that the nitrogen concentration in the High-k film is high in the vicinity of the interface to the gate electrode and decreases with decreasing distance from the silicon substrate. Such a nitrogen concentration distribution cannot be achieved by the above method in which the High-k film is heat-treated in an atmosphere containing $NH_3$ gas or $NO_x$ gas; the High-k film will contain a significant nitrogen concentration even on the silicon substrate side after the heat treatment. Ion-implanting nitrogen into the High-k film is also not preferable since with this method it is difficult to control the nitrogen concentration such that the concentration is high in the vicinity of the surface of the High-k film.

Further, according to the present invention, depositing a silicon nitride film, etc. on the High-k film is also not appropriate. It is possible to deposit a silicon nitride film such that the High-k film has a nitrogen concentration distribution as described above. With this method, however, the resultant gate insulating film has a large physical thickness. In contrast, the plasma nitrided process can introduce a large amount of nitrogen into the surface of the High-k film without increasing the physical thickness of the gate insulating film.

Then, a polysilicon film 25 is formed on the High-k film 24 as a gate electrode material. For example, the polysilicon film 25 may be formed by an LPCVD (Low Pressure Chemical Vapor Deposition) technique to a thickness of approximately 150 nm. It should be noted that according to the present embodiment, an amorphous silicon film or a silicon germanium film may be used instead of the polysilicon film.

Figure 19:
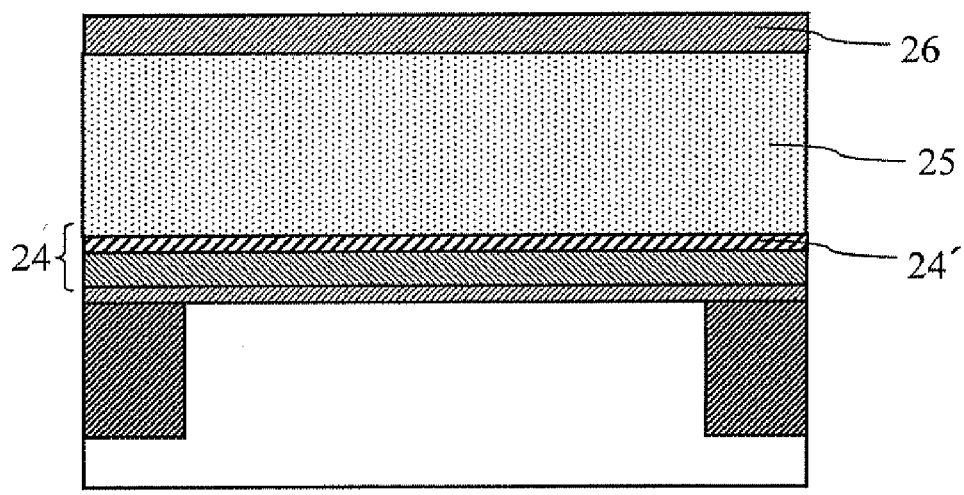

Then, after ion-implanting impurities of an appropriate type in the polysilicon film 25, a silicon oxide film 26 is formed on the polysilicon film 25, as shown in FIG. 19. For example, the silicon oxide film 26 may be formed by an LPCVD technique to a thickness of approximately 30 nm.

Then, the silicon oxide film 26 and the polysilicon film 25 are processed into a gate electrode shape by a photolithographic technique. Furthermore, the High-k film 24 and the silicon oxide film 23 are also processed to form the gate electrode 27 and the gate insulating film 28, as shown in FIG. 20.

Figure 20:
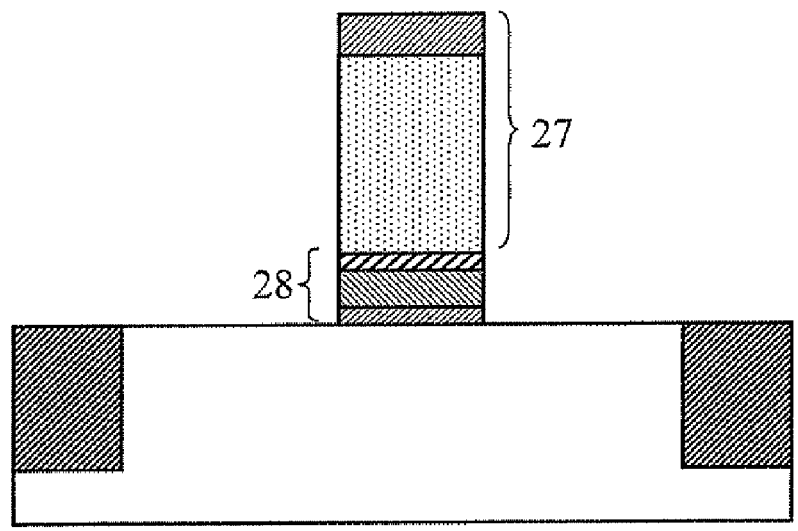
Figure 21:
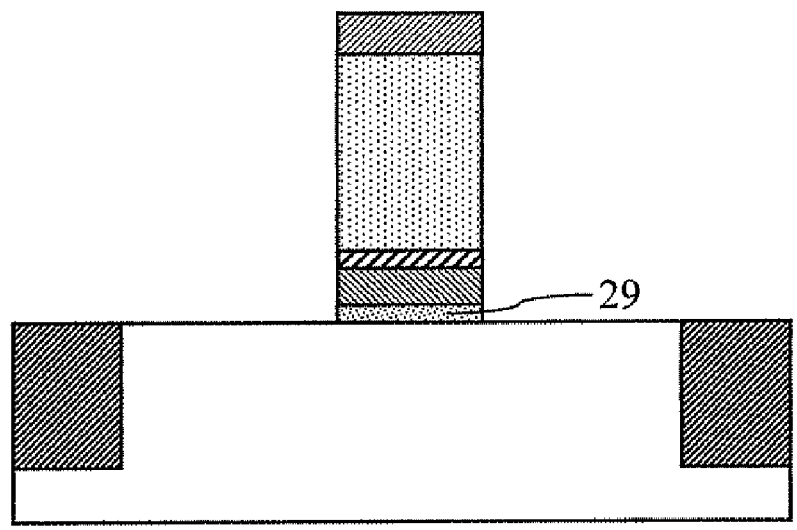

A second characteristic of the present embodiment is that fluorine is ion-implanted in the silicon substrate 21 using the gate electrode 27 as a mask after forming the structure shown in FIG. 20. At that time, the fluorine dose amount is preferably $1 \times 10^{12}$ $cm^{-2}$ to $1 \times 10^{16}$ $cm^{-2}$. However, the dose amount may be set smaller than that for the first embodiment, since after the fluorine implantation process the present embodiment performs a smaller number of heat treatment processes than the first embodiment. That is, the dose amount for the first embodiment is preferably set closer to the maximum value than to the minimum value within the above range, while the dose amount for the second embodiment is preferably set closer to the minimum value than to the maximum value within the above range. Further, the implantation energy is adjusted such that fluorine is not implanted into the gate electrode 27. After the implantation process, a heat treatment is carried out to diffuse fluorine into the silicon oxide film 23, forming a fluorine containing silicon oxide film 29 under the High-k film 24, as shown in FIG. 21.

It should be noted that according to the present embodiment, fluorine is ion-implanted after the silicon oxide film 26 is formed on the polysilicon film 25. This prevents fluorine from being implanted into the polysilicon film 25, allowing suppression of the boron penetration due to fluorine in the gate electrode. However, according to the present embodiment, the silicon oxide film 26 may be omitted, since the problem of the boron penetration depends more heavily on the gate insulating film than the gate electrode.

Then, impurities of an appropriate type are ion-implanted in the silicon substrate 21 using the gate electrode 27 as a mask. After that, a heat treatment is carried out for activation, forming an extension region 30.

It should be noted that in order to suppress short channel effects, the impurity concentration may be increased in an area surrounding the extension region 30 so as to form a halo region (not shown).

Then, a silicon oxide film (not shown) is formed on the entire surface by an LPCVD technique to a thickness of approximately 100 nm and processed by reactive ion etching so as to remove portions of the silicon oxide film other than those on the sides of the gate electrode 27 and the gate insulating film 28, thus forming a sidewall 31 on the sides of the gate electrode 27 and the gate insulating film 28.

Figure 22:
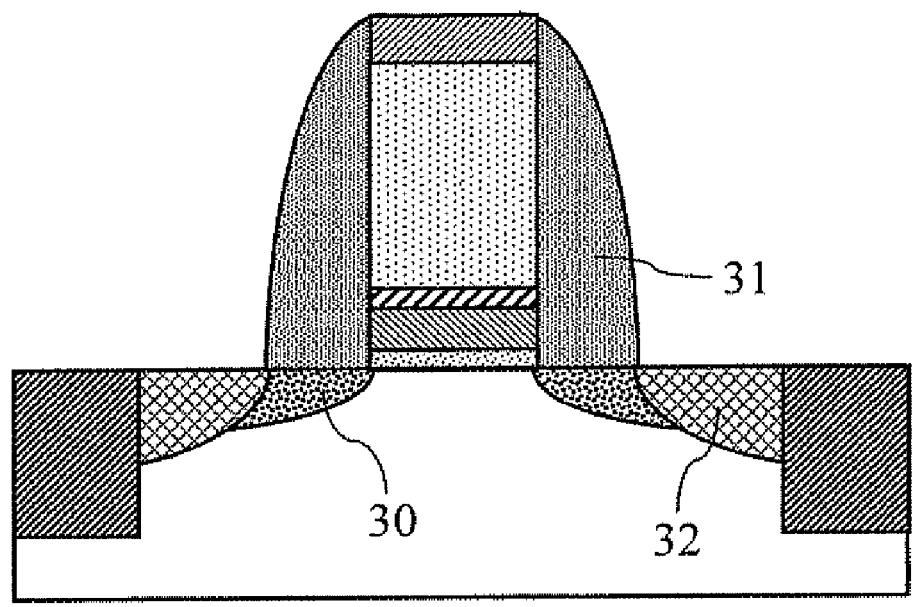

Then, impurities of an appropriate type are implanted in the silicon substrate 21 using the gate electrode 27 with the formed sidewall 31 as a mask. After that, a heat treatment is carried out for activation, forming a source/drain diffusion layer 32, as shown in FIG. 22.

Thus, the present embodiment performs the steps of: sequentially forming the silicon oxide film 23 and the High-k film 24; performing plasma nitrided process on the High-k film 24; forming the gate electrode 27 on the High-k film 24; ion-implanting fluorine in the silicon substrate 21 using the gate electrode 27 as a mask; and performing a heat treatment so as to diffuse fluorine into the silicon oxide film 23 and thereby form the fluorine containing silicon oxide film 29. It should be noted that the gate insulating film is made up of the fluorine containing silicon oxide film 29 and the High-k film 24. The thickness of the fluorine containing silicon oxide film 29 is preferably 1 nm or less, while that of the High-k film 24 is preferably 5 nm or less.

It should be noted that a plurality of heat treatments are carried out after the plasma nitrided process and after the heat treatment following the fluorine ion implantation process described above, which causes atoms to diffuse from one film of the gate insulating film to another. Specifically, nitrogen diffuses from the High-k film 24 to the silicon oxide film 23 (or the fluorine containing silicon oxide film 29), while fluorine diffuses from the fluorine containing silicon oxide film 29 to the High-k film 24. It should be noted that according to the present embodiment, fluorine is localized in the fluorine containing silicon oxide film 29, and nitrogen is localized in the vicinity of the surface of the High-k film 24 before the diffusion of these elements occurs. Therefore, even after their diffusion, fluorine and nitrogen are not evenly distributed in the depth direction of the gate insulating film (the fluorine containing silicon oxide film 29 and the surface of the High-k film 24 still contain high concentrations of fluorine and nitrogen, respectively).

That is, the gate insulating film of the present embodiment is formed such that: the fluorine concentration is high in the vicinity of the interface to the silicon substrate 21 and progressively decreases with decreasing distance from the gate electrode 27; and the nitrogen concentration is high in the vicinity of the interface to the gate electrode 27 and progressively decreases with decreasing distance from the silicon substrate 21. According to the present embodiment, the fluorine concentration in the vicinity of the interface to the silicon substrate 21 is preferably $1 \times 10^{19}$ cm$^{-3}$ or more, while the nitrogen concentration in the vicinity of the interface to the gate electrode 27 is preferably $1 \times 10^{20}$ cm$^{-3}$ or more.

Distributing fluorine and nitrogen within the gate insulating film as described above has the following effects. Since the gate insulating film contains a large amount fluorine but substantially no nitrogen in the vicinity of the interface to the silicon substrate, the influence of fluorine is predominant in this region, allowing reliability factors such as NBTI to be effectively improved. On the other hand, since the gate insulating film contains a large amount of nitrogen but substantially no fluorine in the vicinity of the interface to the gate electrode, the influence of nitrogen is predominant in this region, allowing the penetration of boron from the gate electrode to be effectively suppressed. Therefore, the present invention can enhance reliability while solving the problem of boron penetration, which has not been achieved by conventional semiconductor devices in which fluorine and nitrogen are simply added into the High-k film.

It should be noted that even though the present embodiment implants fluorine before forming the extension region, the present invention is not limited to this particular arrangement. For example, fluorine may be implanted when ions are implanted to form the extension region. Alternatively, if a halo region is to be provided, the fluorine implantation may be carried out in the ion implantation process for forming the halo region. Further, the fluorine implantation may be carried out after forming the sidewall insulating film, or it may be performed in the same process in which ions are implanted to form the source/drain diffusion layer.

The features and advantages of the present invention may be summarized as follows.

The semiconductor device of the first aspect of the present invention includes a gate insulating film formed such that: it contains at least hafnium, oxygen, fluorine, and nitrogen; the fluorine concentration is high in the vicinity of the interface to the silicon substrate and progressively decreases with decreasing distance from the gate electrode; and the nitrogen concentration is high in the vicinity of the interface to the gate electrode and progressively decreases with decreasing distance from the silicon substrate. Therefore, in the vicinity of the interface to the silicon substrate, the influence of fluorine is predominant, allowing reliability factors such as NBTI to be effectively improved. In the vicinity of the interface to the gate electrode, on the other hand, the influence of nitrogen is predominant, allowing the penetration of boron from the gate electrode to be effectively suppressed.

Further, according to the second aspect of the present invention, a high dielectric constant insulating film is formed on a fluorine containing silicon oxide film and then a silicon nitride film is formed on the high dielectric constant insulating film. This arrangement allows a gate insulating film to be formed such that: its fluorine concentration is high in the vicinity of the interface to the silicon substrate and progressively decreases with decreasing distance from the gate electrode; and its nitrogen concentration is high in the vicinity of the interface to the gate electrode and progressively decreases with decreasing distance from the silicon substrate. Therefore, it is possible to enhance reliability while solving the problem of boron penetration.

Still further, according to the third aspect of the present invention, a high dielectric constant insulating film is formed on a silicon oxide film and then the surface of the high dielectric constant insulating film is performed plasma nitrided process. Furthermore, after the above process, fluorine is ion-implanted in the silicon substrate using the gate electrode as a mask, transforming the silicon oxide film into a fluorine containing silicon oxide film. This arrangement allows a gate insulating film to be formed such that: its fluorine concentration is high in the vicinity of the interface to the silicon substrate and progressively decreases with decreasing distance from the gate electrode; and its nitrogen concentration is high in the vicinity of the interface to the gate electrode and progressively decreases with decreasing distance from the silicon substrate. Therefore, it is possible to enhance reliability while solving the problem of boron penetration.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2004-175803, filed on Jun. 14, 2004 including specification, claims, drawings and summary, on which the Convention priority of the present application is based, are incorporated herein by reference in its entirety.

What is claimed is:

1. A method for manufacturing a semiconductor device, comprising:
   ion-implanting fluorine in a silicon substrate;
   thermally oxidizing said silicon substrate to form a fluorine-containing silicon oxide film on said silicon substrate;
   forming a high dielectric constant insulating film on said fluorine-containing silicon oxide film;
   forming a silicon nitride film on said high dielectric constant insulating film, said fluorine-containing silicon film, said high dielectric constant insulating film, and said silicon nitride film constituting a gate insulating film structure;
   forming a silicon film on said silicon nitride film;
   processing said silicon film to form a gate electrode; and
   heat treating said silicon substrate to diffuse fluorine from said fluorine-containing silicon oxide film and nitrogen from said silicon nitride film into said high dielectric constant insulating film, wherein, in said gate insulating film structure, concentration of fluorine progressively decreases from an interface of said gate insulating film structure with said silicon substrate to an interface of said gate insulating film structure with said gate electrode, and concentration of nitrogen progressively decreases from the interface of said gate insulating film structure with said gate electrode to the interface of said gate insulating film structure with said silicon substrate.

2. The method as claimed in claim 1, further comprising, after forming said gate electrode, processing said gate insulating film structure including said silicon nitride film, said high dielectric constant insulating film, and said fluorine-containing silicon oxide film, using said gate electrode as a mask, to form a gate insulating film.

3. The method as claimed in claim 1, including ion-implanting fluorine at a dosage in a range from $1\times10^{12}$ cm$^{-2}$ to $1\times10^{16}$ cm$^{-2}$.

4. The method as claimed in claim 1, wherein said high dielectric constant insulating film is a material selected from the group consisting of $HfO_2$, $HfAlO_x$, and $HfSiO_x$.

5. A method for manufacturing a semiconductor device, comprising:
   thermally oxidizing a silicon substrate to form a silicon oxide film on said silicon substrate;
   forming a high dielectric constant insulating film on said silicon oxide film;
   plasma nitriding said high dielectric constant insulating film to form a plasma-nitrided portion, said silicon oxide film and said high dielectric constant film, including said plasma-nitrided portion, constituting a gate insulating film structure;
   after the plasma nitriding, forming a silicon film on said high dielectric constant insulating film;
   processing said silicon film to form a gate electrode;
   ion-implanting fluorine in said silicon substrate, using said gate electrode as a mask; and
   heat-treating said silicon substrate to diffuse fluorine from said silicon substrate to transform said silicon oxide film into a fluorine-containing silicon oxide film and nitrogen from said plasma-nitrided portion of said high dielectric constant insulating film into said high dielectric constant insulating film, wherein, in said gate insulating film structure, concentration of fluorine progressively decreases from an interface of said gate insulating film structure with said silicon substrate to an interface of said gate insulating film structure with said gate electrode, and concentration of nitrogen progressively decreases from the interface of said gate insulating film structure with said gate electrode to the interface of said gate insulating film structure with said silicon substrate.

6. The method as claimed in claim 5, further comprising, after forming said silicon film, forming a silicon oxide film on said silicon film, wherein forming said gate electrode includes processing said silicon oxide film and said silicon film.

7. The method as claimed in claim 5, further comprising, after forming said gate electrode, processing said gate insulating film structure, including said high dielectric constant insulating film, including said plasma-nitrided portion, and said silicon oxide film, using said gate electrode as a mask, to form a gate insulating film.

8. The method as claimed in claim 5, including ion-implanting fluorine at a dosage in a range from $1\times10^{12}$ cm$^{-2}$ to $1\times10^{16}$ cm$^{-2}$.

9. The method as claimed in claim 5, wherein said high dielectric constant insulating film is a material selected from the group consisting of $HfO_2$, $HfAlO_x$, and $HfSiO_x$.

* * * * *